United States Patent
Bischoff et al.

(10) Patent No.: US 8,569,693 B2
(45) Date of Patent: Oct. 29, 2013

(54) DISTORTION FREE STIGMATION OF A TEM

(75) Inventors: Maarten Bischoff, Uden (NL); Alexander Henstra, Utrecht (NL); Uwe Luecken, Eindhoven (NL); Peter Christiaan Tiemeijer, Eindhoven (NL)

(73) Assignee: FEI Company, Hillsboro, OR (US)

(*) Notice: Subject to any disclaimer, the term of this patent is extended or adjusted under 35 U.S.C. 154(b) by 26 days.

(21) Appl. No.: 13/446,908

(22) Filed: Apr. 13, 2012

(65) Prior Publication Data

US 2013/0062520 A1    Mar. 14, 2013

Related U.S. Application Data

(60) Provisional application No. 61/475,117, filed on Apr. 13, 2011.

(30) Foreign Application Priority Data

Apr. 13, 2011   (EP) ..................................... 11162275

(51) Int. Cl.
    *G21K 7/00*    (2006.01)
(52) U.S. Cl.
    USPC ............ 250/311; 250/310; 250/307; 250/398
(58) Field of Classification Search
    USPC ..................................................... 250/396 R
    See application file for complete search history.

(56) References Cited

U.S. PATENT DOCUMENTS

| | | | |
|---|---|---|---|
| 2,919,381 A | 12/1959 | Glaser | |
| 3,979,590 A | 9/1976 | Andersen | |
| 4,095,104 A | 6/1978 | LePoole et al. | |
| 4,209,702 A * | 6/1980 | Shirai et al. ............ | 250/396 ML |
| 4,303,864 A | 12/1981 | Crewe et al. | |
| 4,362,945 A | 12/1982 | Riecke | |
| 4,379,230 A | 4/1983 | Bouwhuis et al. | |
| 4,389,571 A | 6/1983 | Crewe | |
| 4,414,474 A | 11/1983 | Crewe | |
| 4,618,766 A | 10/1986 | ven der Mast et al. | |
| 4,684,808 A | 8/1987 | Plies et al. | |
| 4,853,545 A | 8/1989 | Rose | |

(Continued)

FOREIGN PATENT DOCUMENTS

| | | |
|---|---|---|
| DE | 873729 | 4/1953 |
| DE | 4204512 | 8/1993 |

(Continued)

OTHER PUBLICATIONS

'Third Team Workshop,' Aug. 8, 2003, 43 pgs, organized by Christian Kisielowski, et al., San Antonio, Texas.

(Continued)

*Primary Examiner* — Robert Kim
*Assistant Examiner* — Sean Luck
(74) *Attorney, Agent, or Firm* — Scheinberg & Associates, PC; Michael O. Scheinberg

(57) ABSTRACT

A charged particle apparatus is equipped with a third stigmator positioned between the objective lens and a detector system, as a result of which a third degree of freedom is created for reducing the linear distortion. Further, a method of using said three stigmators, comprises exciting the first stigmator to reduce astigmatism when imaging the sample, exciting the second stigmator to reduce astigmatism when imaging the diffraction plane, and exciting the third stigmator to reduce the linear distortion.

14 Claims, 3 Drawing Sheets

(56) References Cited

U.S. PATENT DOCUMENTS

| | | | |
|---|---|---|---|
| 4,859,857 | A | 8/1989 | Stengl et al. |
| 4,899,091 | A * | 2/1990 | Odenthal ............... 315/382 |
| 4,962,313 | A | 10/1990 | Rose |
| 5,084,622 | A | 1/1992 | Rose |
| 5,221,844 | A | 6/1993 | van der Mast et al. |
| 5,300,775 | A | 4/1994 | Van der Mast |
| 5,336,891 | A | 8/1994 | Crewe |
| 5,422,486 | A | 6/1995 | Herrmann et al. |
| 5,448,063 | A | 9/1995 | de Jong et al. |
| 5,581,347 | A | 12/1996 | Le Saux et al. |
| 5,798,524 | A | 8/1998 | Kundmann et al. |
| 5,838,011 | A | 11/1998 | Krijn et al. |
| 5,965,894 | A | 10/1999 | Krijn et al. |
| 5,986,269 | A | 11/1999 | Krijn et al. |
| 6,184,975 | B1 | 2/2001 | Henstra et al. |
| 6,191,423 | B1 | 2/2001 | Krijn et al. |
| 6,246,058 | B1 | 6/2001 | Tiemeijer |
| 6,248,486 | B1 | 6/2001 | Dirksen et al. |
| 6,301,008 | B1 | 10/2001 | Ziger et al. |
| 6,329,659 | B1 | 12/2001 | Krijn et al. |
| 6,368,763 | B2 | 4/2002 | Dirksen et al. |
| 6,388,261 | B1 | 5/2002 | Nakasuji |
| 6,426,501 | B1 | 7/2002 | Nakagawa |
| 6,455,848 | B1 | 9/2002 | Krijn et al. |
| 6,489,621 | B1 | 12/2002 | Frosien |
| 6,552,340 | B1 | 4/2003 | Krivanek et al. |
| 6,605,810 | B1 | 8/2003 | Haider et al. |
| 6,693,282 | B1 | 2/2004 | Tiemeijer |
| 6,723,997 | B2 | 4/2004 | Matsuya et al. |
| 6,737,647 | B2 | 5/2004 | Schonhense et al. |
| 6,770,887 | B2 | 8/2004 | Krivanek et al. |
| 6,852,983 | B2 | 2/2005 | Matsuya et al. |
| 6,858,844 | B2 | 2/2005 | Zach |
| 6,888,145 | B2 | 5/2005 | Muller et al. |
| 6,924,488 | B2 | 8/2005 | Matsuya et al. |
| 6,943,349 | B2 | 9/2005 | Adamec et al. |
| 6,946,657 | B2 | 9/2005 | Kienzle et al. |
| 6,992,289 | B2 | 1/2006 | Maes et al. |
| 7,005,641 | B2 | 2/2006 | Nakasuji et al. |
| 7,012,262 | B2 | 3/2006 | Rose |
| 7,034,315 | B2 | 4/2006 | Henstra et al. |
| 7,060,986 | B2 | 6/2006 | Nakamura et al. |
| 7,164,128 | B2 | 1/2007 | Miyamoto et al. |
| 7,282,722 | B2 | 10/2007 | Sato et al. |
| 7,378,667 | B2 | 5/2008 | Henstra |
| 7,408,172 | B2 | 8/2008 | Sato et al. |
| 7,420,179 | B2 | 9/2008 | Hosokawa |
| 7,518,121 | B2 | 4/2009 | Maas et al. |
| 7,544,939 | B2 | 6/2009 | van der Zande et al. |
| 2002/0056808 | A1* | 5/2002 | Tsuneta et al. ............... 250/306 |
| 2002/0121609 | A1* | 9/2002 | Hosokawa ............ 250/396 ML |
| 2004/0036021 | A1 | 2/2004 | Todokoro et al. |
| 2004/0036030 | A1 | 2/2004 | Matsuya et al. |
| 2004/0036031 | A1* | 2/2004 | Rose et al. ............... 250/396 R |
| 2005/0001178 | A1* | 1/2005 | Parker et al. ............... 250/494.1 |
| 2008/0290264 | A1 | 11/2008 | Henstra et al. |
| 2010/0072366 | A1 | 3/2010 | Tiemeijer et al. |
| 2011/0114852 | A1 | 5/2011 | Henstra |
| 2012/0153147 | A1* | 6/2012 | Zach et al. ............... 250/311 |
| 2012/0199739 | A1* | 8/2012 | Nakano et al. ............... 250/307 |

FOREIGN PATENT DOCUMENTS

| | | |
|---|---|---|
| DE | 19633496 | 2/1998 |
| GB | 1364930 | 8/1974 |
| GB | 2001799 | 2/1979 |
| JP | 1264149 | 10/1989 |
| JP | 2004087460 | 3/2004 |
| JP | 2007180013 | 12/2007 |
| WO | WO9812732 | 3/1998 |
| WO | WO9930343 | 6/1999 |
| WO | WO0036630 | 6/2000 |
| WO | WO03032351 | 4/2003 |

OTHER PUBLICATIONS

Haider, M. et al., "Upper Limits for the Residual Aberrations of a High-Resolution Aberration-Corrected STEM," Ultramicroscopy, 2000, pp. 163-175, vol. 81.

Koops, H., "Aberration Correction in Electron Microscopy," The Instrument Today and Tomorrow, Ninth International Congress on Electron Microscopy, Publication Date Unknown, Toronto, pp. 185-196.

Jones, H.W., "An Apparatus for Determining the Secondary Electron Emission Properties of Nonconductors," Journal of Physics E. Scientific Instruments, Dec. 1, 1970, pp. 997-999, vol. 3, No. 12.

Carson, K.R. et al., "An Improved Standard Specimen for Alignment of Electron Microscopes," Journal of Science Instruments, 1967, pp. 1036-1037, vol. 44.

Ohnishi, T. et al., "Development of an FIB System Using a Ga-In-Sn LMIS," Central Research Laboratory, Hitachi Ltd., Publication Date Unknown, pp. 101-104.

Bernhard, W., "Erprobung Eines Spharisch Und Chromatisch Korrigierten Elektronenmikroskopes," Optik, 1980, pp. 73-94, vol. 57, No. 1.

Mitrofanov A.V. et al, "INSPEC/IEE," 1992, 1 page.

Krohn, V.E. et al., "Ion Source of High Brightness Using Liquid Metal," Applied Physics Letters, Nov. 1975, pp. 479-481, vol. 27, No. 9.

Hibi, T. et al., "On a Slit for Objective Electron Lens," Research Institute for Scientific Measurements, 1954, pp. 511-516, vol. 6.

Hasimoto, H. et al., "Pseudo-Aberration Free Focus Condition for Atomic Resolution Electron Microscope Images," Micron, 1998, pp. 113-121, vol. 29, No. 2/3.

Canemco, "Scanning Electron Microscopy Supplies," Webpages, www.canemco.com, Publication Date Unknown, 33 Pages.

Canemco, "SEM Calibration Standards," Webpages, www.canemco.com, Publication Date Unknown, 1 page.

Joy, D.C., "SEM Parameters and their Measurement," Scanning Electron Microscopy, Apr. 1974, pp. 327-334, Part 1.

Guiton, B. et al.,"Single-Crystalline Vanadium Dioxide Nanowires with Rectangular Cross Sections," J. Am. Chem. Soc., 2005, pp. 498-499, vol. 127.

Kaynig, V. et al., "Probabilistic Image Registration and Anomaly Detection by Nonlinear Warping," Computer Vision and Pattern Recognition, IEEE Conference, Jun. 2008, pp. 1-8.

Lowe, D., "Distinctive Image Features from Scale-Invariant Keypoints," International Journal of Computer Vision, 2004, pp. 91-110, vol. 60, No. 2.

Heckman, F.A. et al., "The Reduction of Error in Magnification Determination in Electron Microscopes," Electron Microscopy, Fifth International Congress, Aug. 1962, 2 Pages, vol. 1.

'Workshop Report: Aberration correction in electron microscopy—Materials research in an aberration-free environment,' Jul. 18-20, 2000, 81 pgs, sponsored and organized by Electron Microscopy Center (EMC), et al.

Hou, Vincent D.-H., et al, 'A Method to Correct Elliptical Distortion of Diffraction Patterns in TEM,' Microscopy and Microanalysis, Jan. 1, 2008, pp. 1126-1127, vol. 14.

* cited by examiner

DISTORTION FREE STIGMATION OF A TEM

This Application claims priority from U.S. Provisional Application 61/475,117, filed Apr. 13, 2011, which is hereby incorporated by reference.

TECHNICAL FIELD OF THE INVENTION

The invention relates to a charged particle apparatus equipped for reducing astigmatism and distortion, and method thereof.

BACKGROUND OF THE INVENTION

In a TEM a sample, such as a thin slice of biological material or a thin slice of semiconductor material, with a thickness of typically between 2 nm to 1 μm, is irradiated with an energetic beam of electrons. The energy of the electrons is, for example, adjustable between 50 to 400 keV, although TEMs using a higher and/or lower energy are known to be used. The sample is placed in or near the objective lens of the TEM, so that the objective lens forms a first image of the sample with a magnification of, for example, 20 times.

As known to the skilled artisan a TEM has two major modes of operation, one in which the sample is imaged on the detector system, and one in which the back focal plane of the objective lens is imaged on the detector system. The back focal plane contains the diffraction pattern of the sample. The detector system can, for example, be a fluorescent screen, or a CMOS detector. The sample may be imaged on the detector with a magnification of, for example, $10^6$ times, with a corresponding resolution of 100 pm or less.

A typical TEM is equipped with two stigmators after the objective lens, one in a plane close to the objective lens for correcting the astigmatism in imaging mode (when the sample is imaged), and one close to the plane of the first intermediate imaging for correcting the astigmatism in diffraction mode (when the diffraction pattern is imaged).

In imaging mode the sample is imaged on, for example, the fluorescent screen of the TEM, or another detector such as a CCD camera, a CMOS camera, or the like. The objective stigmator is used to correct the astigmatism of the objective lens, and tuning is done by observing the image of the sample.

In diffraction mode the diffraction plane is imaged on, for example, the fluorescent screen of the TEM, or another detector such as a CCD camera, a CMOS camera, or the like. The diffraction stigmator is used to correct the astigmatism of the diffraction lens, and tuning is done by observing the image of the diffraction pattern.

A problem using one stigmator for correcting the astigmatism is that Linear Distortion (LD) arises: the magnification in two perpendicular directions may be different. This is shown in FIG. 1. FIG. 1A schematically shows a beam with astigmatism, where the strength of the objective lens in one direction is slightly different from its strength in another direction. This can be caused by, for example, imperfections in the shape of the objective lens. We choose x and y axes such that the x-z plane is the plane in which the objective lens is weakest, and the y-z plane is the plane in which the objective is the strongest. The focus in the x-z plane is slightly different from the focus in the y-z plane. In FIG. 1B this is corrected with a stigmator, and the foci in the x-z and the y-z plane coincide. However, the angles $\beta_x$ and $\beta_y$ are not identical, and, as the angular magnification in the x-z plane differs from the angular magnification of the y-z plane, also the spatial magnification differs between the x-z plane and the y-z plane.

It is noted that, as the stigmator has different effects in the x-z and the y-z plane, the magnification error introduced by using only one stigmator is linear distortion (LD): the magnification in the x- and the y-direction differ. FIG. 1C shows a solution to this problem by using a second stigmator.

The use of two stigmators to correct LD in diffraction mode is known from "A Method to Correct Elliptical Distortion of Diffraction Patterns in TEM", Hou et al., Microsc Microanal 14 (suppl. 2) 2008, page 1126. In said article the magnification error is dubbed elliptical error. To determine this error the objective lens stigmator of a TEM is set on an arbitrarily value, the diffraction lens stigmator is adjusted accordingly to minimize the astigmatism in the diffraction image, and the LD (here named elliptical distortion) in the diffraction pattern is measured. This is repeated for different values of the objective lens stigmator to form a 2D contour plot representing the LD for all objective lens stigmator settings (and correspondingly optimized diffraction lens stigmator settings).

The use of two stigmators to correct LD in a lithographic apparatus while imaging a reticle on a wafer is known from U.S. Pat. No. 6,388,261. The patent describes an apparatus in which the reticle is imaged by a doublet of lenses, whereby the magnification can be tuned. Each of the two lenses is surrounded by a stigmator, in which one stigmator is used mainly to correct the astigmatism of the doublet and the other one to correct mainly the LD.

The above two examples show that it is in principle possible and known to adjust astigmatism and LD simultaneously with two stigmators.

As known to the skilled artisan the position of a stigmator cannot be arbitrarily chosen: the strength of the magnetic or electrostatic field used in a stigmator scales linearly with the distance to the axis. Therefore stigmating a beam with a small diameter requires a larger excitation of a stigmator than stigmating a beam with a large diameter. For a beam diverging from or to an intermediate image, the beam diameter scales linearly with the distance from the intermediate image. Thus at the image, where the beam has a cross-over, a stigmator even has no stigmating effect. Furthermore, the effect of a stigmator also scales linearly with the distance between the stigmator and the plane where the image is formed. Thus for a beam diverging from or to an intermediate image, the effect of a stigmator thus scales quadratically with the distance of the stigmator to the plane where the image is formed.

Therefore, a stigmator is preferably placed at the position where the beam has a large diameter and far from the plane where the image is formed.

As a TEM has two modes of operation, one in which the image plane is imaged and one in which the diffraction plane is imaged, a typical TEM is equipped with two stigmators between the sample and the imaging system, one in a plane close to the objective for correcting the astigmatism in the image when the image is imaged, and one near the diffraction lens (that is: the first lens of the imaging system after the objective lens) for correcting the astigmatism in the diffraction plane when the diffraction plane is imaged.

The resulting two degrees of freedom (one for each stigmator) are used to correct astigmatism in the objective and diffraction plane.

The two stigmators can work together to form a virtual plane in which the combined action occurs. This combined action can be the correction of astigmatism and the correction of the LD. This plane can be chosen to coincide with the plane where the object resides, or to coincide with the diffraction plane.

A problem arises when using two stigmators to correct astigmatism in the two modes (imaging mode and diffraction mode) and also correct for LD with those stigmators: when switching between modes, also the excitation of the stigmators must be changed. This is explained as follows: in the imaging mode the imaging stigmator is used to correct the astigmatism and the other stigmator, the diffractor stigmator, to correct the LD. In diffraction mode, the diffractor stigmator is used to correct for astigmatism and the other stigmator, the objective stigmator, to correct the LD. The change in excitation causes a different ohmic heat production in the coils of the stigmator, typically a change of several watt, resulting in drift of the image due to the resultant temperature drift. The required stabilization time in the order of tens of minutes. Also hysteresis may occur, especially when iron yokes are used.

Accordingly, there is a need to provide an apparatus and method for correcting astigmatism in two planes, and correct Linear Distortion simultaneously, without drift caused by different excitation of the stigmators.

SUMMARY OF THE INVENTION

The invention relates to a charged particle apparatus equipped with a charged particle source for emitting a beam of charged particles, downstream of the beam are condenser optics, followed by a sample position, followed by an objective lens, followed by imaging optics, and followed by a detector system, in which, between the objective lens and the detector system, a first stigmator is positioned for reducing astigmatism when imaging a sample on the detector system and a second stigmator is positioned for reducing astigmatism when the diffraction plane is imaged on the detector system, and a third stigmator is positioned between the objective lens and the detector system, as a result of which a third degree of freedom is created for reducing the linear distortion.

The invention further relates to a method of using said three stigmators, the method comprising exciting the first stigmator to reduce astigmatism when imaging the sample, exciting the second stigmator to reduce astigmatism when imaging the diffraction plane, and exciting the third stigmator to reduce the linear distortion.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Figure 1:
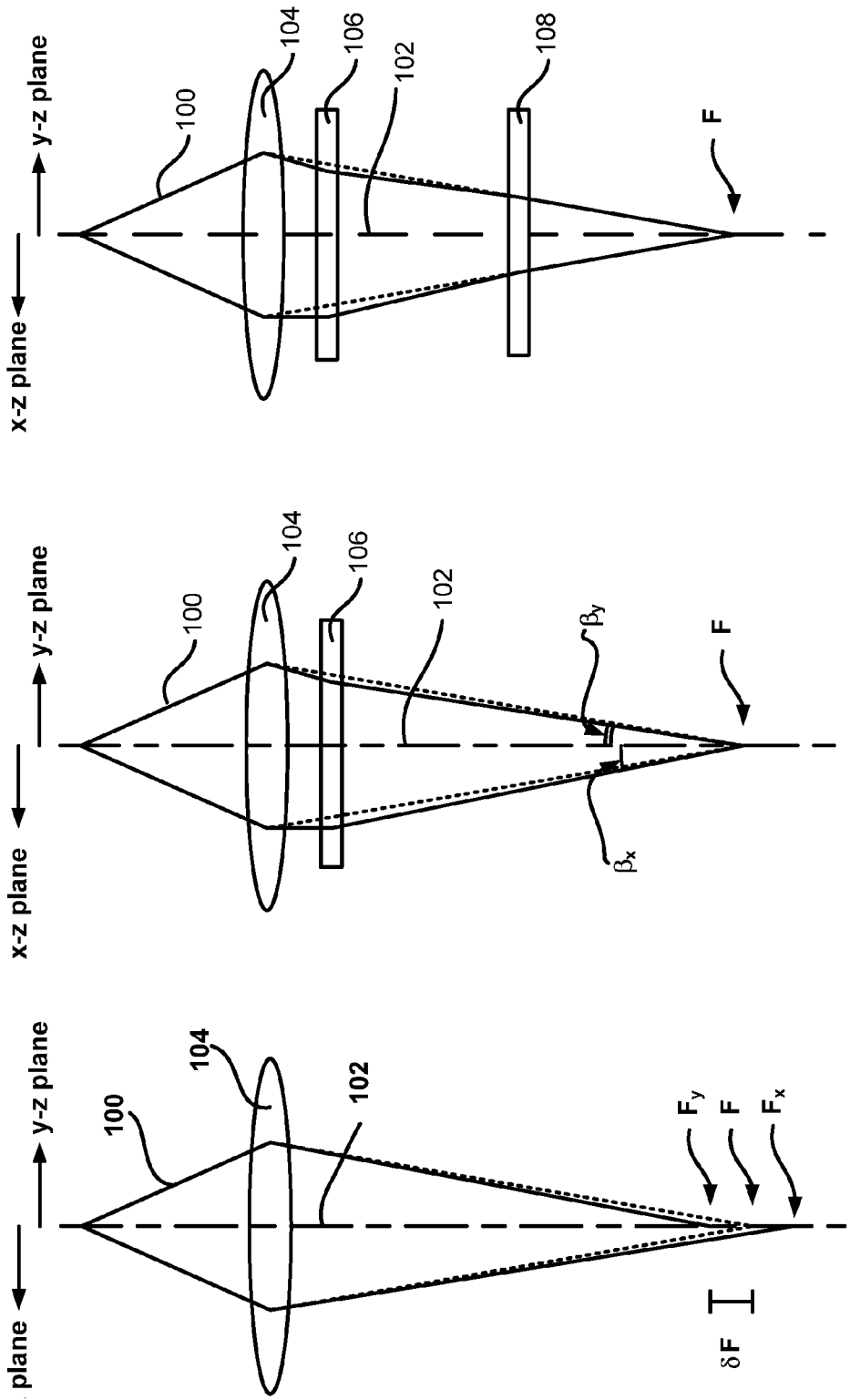
FIGS. 1A, 1B and 1C schematically show the working of a set of stigmators.

A TEM according to the invention is characterized in that a third stigmator is positioned between the objective lens and the detector system, as a result of which a third degree of freedom is created for reducing the linear distortion.

The invention is based on the insight that it is possible to excite three stigmators in such a manner that astigmatism in both modes (imaging mode and diffraction mode) is possible without Linear Distortion. Therefore also no dissipation changes occur, and thus no drift is introduced by change of stigmator dissipation. It will be clear to the person skilled in the art that the stigmators should not be imaged upon each other: it should be an independent set of stigmators Preferably the three stigmators are placed between the objective lens and the imaging optics. The magnification of the imaging optics can then be changed without having to change stigmator excitation, as all lenses of the imaging optics are between the stigmators and the image plane. Also, as the lenses of the imaging optics produce enlarged images, the effect of stigmators is less when they are placed more 'downstream', and the excitation should be larger. Another advantage of placing the stigmators between the objective lens and the imaging optics is that, as a magnetic lens introduces rotation, the orientation of the stigmator should also be changed when the excitation of a lens between the objective lens and the stigmator is changed, resulting in a more complex operation. Still another advantage of placing the stigmators in this volume is that, as there are no lenses between the stigmators, there is no change (for any magnification setting) that one stigmator being imaged on another, thereby reducing the degrees of freedom to two.

It is noted that most of the astigmatism is introduced by the objective lens and to a lesser degree by the diffraction lens (the effect of lenses closer to the image plane can be neglected). The effect of other lenses in the imaging system can be ignored, and thus changing the magnification of these lenses has no effect on astigmatism.

Preferably the apparatus is equipped with a user interface in which the astigmatism in imaging mode, astigmatism in diffraction mode and the correction of the LD are controlled independent of each other.

A method of using the three stigmators comprises exciting the first stigmator for reducing the astigmatism in imaging mode, exciting the second stigmator for reducing the astigmatism in diffraction mode, characterized in that the method comprises exciting the third stigmator for reducing the linear distortion. For this method, it is important to note that ideal positions exist for the stigmators such that the first stigmator does not affect the LD but only the astigmatism in imaging mode, that the second stigmator does not affect the LD but only the astigmatism in diffraction mode, and that the third stigmator mainly affects the LD and only slightly the astigmatism in imaging and in diffraction mode. In practice, mechanical restrictions cause that it is not always possible to mount the stigmators at these ideal positions but only closely to these ideal positions. Then, for example, the first stigmator does not purely affect the image astigmatism but also slightly the diffraction astigmatism and slightly the LD. In that case, it is possible to make three new controls which each change the three stigmators simultaneously with different ratios, such that each new control affects only the image astigmatism, or only the diffraction astigmatism, or only the LD.

The result of the method is that the three stigmators are excited such, that all three demands (astigmatism in imaging mode, astigmatism in diffraction mode and LD are zero) are met simultaneously, and therefore no changes in excitation are needed when changing from one mode to another.

FIG. 1A schematically shows a beam 100 focused by a lens 104. Both the beam and the lens are centered around axis 102. The lens focuses the beam at cross-over position F, but due to astigmatism the cross-over position in the x-z plane, $F_x$, slightly differs from the cross-over position in the y-z plane, $F_y$.

FIG. 1B schematically shows the effect of a stigmator 106. A stigmator can be thought of as a lens that has a positive strength in one plane (the x-z plane) and an equal but negative strength in the plane perpendicular thereto (the y-z plane). The strength of a stigmator is with respect to the x-z plane defined as $$A_i = \frac{\Delta r'}{r},$$

where $\Delta r'$ is the change of angle (change in slope) of a ray that impinges on the stigmator, the ray impinging on the stigmator at a distance r from the axis. As a result, when placing a stigmator between a lens and a cross-over, astigmatism can be corrected, as a result of which the cross-over in the x-z and the y-z plane coincide. However, the opening angles $\beta_x$ in the x-z plane and $\beta_y$ in the y-z plane differ. As a result the magnifications $M_x$ and $M_y$ in the x-z and y-z plane differ, because $M_x \cdot \beta_x = M_y \cdot \beta_y$.

FIG. 1C schematically shows how, by introducing an extra stigmator 108, the astigmatism can be corrected while the magnification in both directions is identical.

Figure 2:
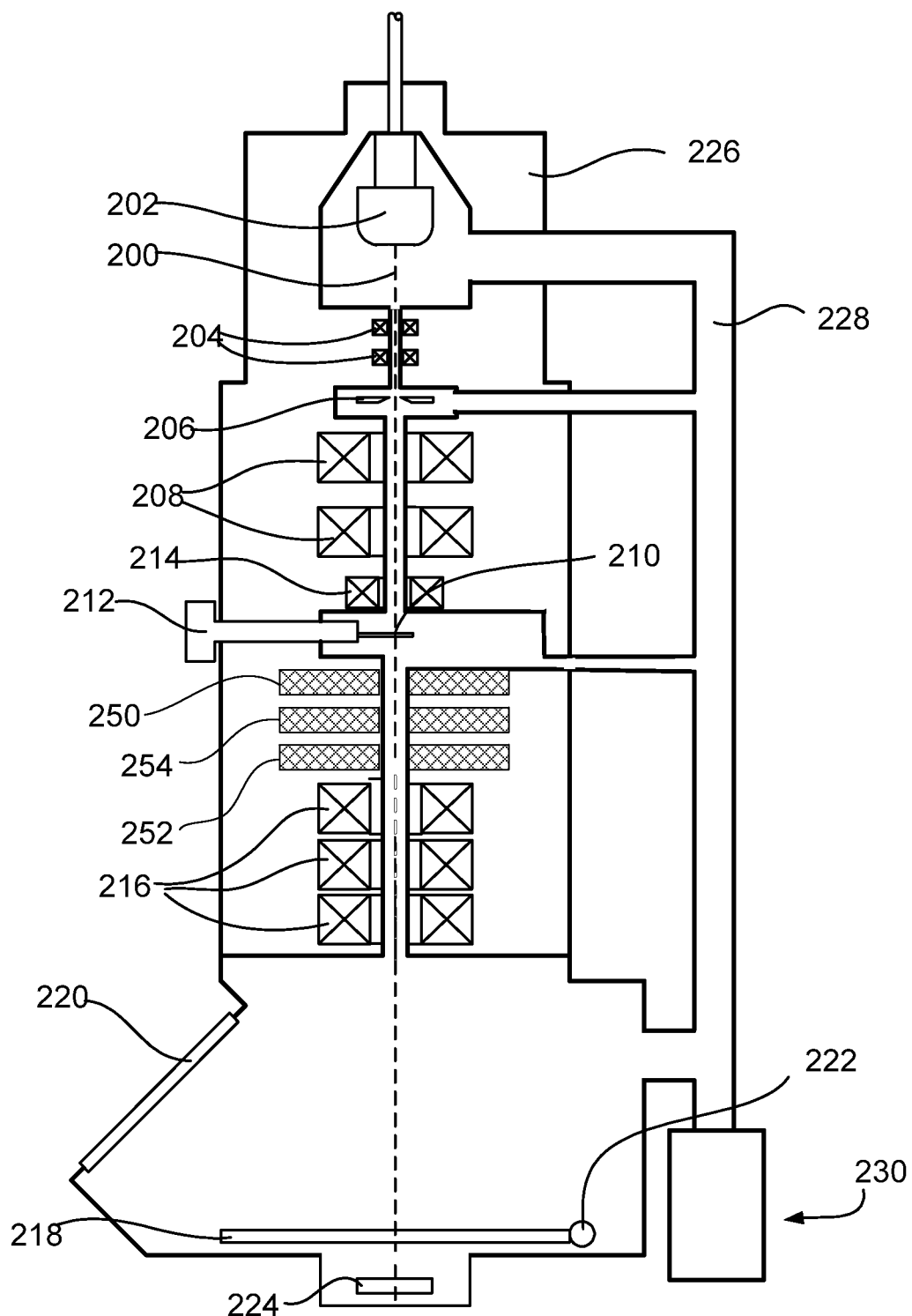
FIG. 2 schematically shows an apparatus according to the invention.

FIG. 2 schematically shows a TEM according to the invention in imaging mode. FIG. 2 shows an electron source 202 emitting a beam of electrons along an optical axis 200. The beam is centered round the axis by alignment coils 204. The opening angle of the beam is limited by the beam limiting aperture 206 and then the beam is collimated (condensed) by the condenser lenses 208 onto the sample 210. The sample is mounted on a sample holder 212, so that it can be positioned with respect to the axis. The sample resides in the magnetic field of the objective lens 214, so that an intermediate image is made. Projector lenses 216 in the imaging optics further magnify this image, as a result of which a greatly magnified image is formed in the fluorescent screen 218. The fluorescent screen can be observed via viewing port 220. The fluorescent screen is mounted on a hinge 222, and can be taken out of the path of the beam. This enables an image to be made on another type of detector, such as a CMOS camera 224. The microscope further comprises a housing 226, vacuum tubing 228 and one or more vacuum pumps 230 [e.g. one or more pumps from the group of Ion Getter Pump (IGP), Turbo-Molecular Pump (TMP), Oil Diffusion Pump (ODP), or the like, if necessary supplemented by so-named pre-vacuum pumps]. Further the microscope comprises a controller (not shown), displays (not shown) etc., enabling control of the microscope by the user and display of images made by e.g. detector 224.

The microscope also comprises three stigmators between the sample and the first image plane, the objective stigmator 250 for mainly reducing astigmatism when imaging the sample, the diffraction stigmator 252 for mainly reducing astigmatism when imaging the diffraction plane, and the LD stigmator 254 for mainly reducing the linear distortion. It is noted that prior art microscopes are not equipped with the LD stigmator.

In working the electron source produces a beam of electrons with an adjustable energy of typically between 50 and 400 keV. The beam is centered on the axis, and the opening angle (and thus the current) is limited by the beam limiting aperture. The condenser lenses then condense the beam onto the sample. The condenser lenses thus determine the divergence/convergence angle of the beam on the sample, and the area of the sample that is illuminated.

The sample typically has a thickness of between 2 nm and 1 μm. Many of the impinging electrons travel through the sample, but many of them will interact with the sample. The interaction can be absorption, scattering and/or energy loss. The absorbed electrons will cause intensity fluctuations in the image, the scattered electrons will, by interference with non-scattered electrons, result in a phase contrast image. The energy loss can be imaged by special electron energy loss spectrometers.

In imaging mode the objective lens forms an enlarged intermediate image of the sample, that is further magnified by the projector lenses to form an image on the screen or the detector.

In diffraction mode not the sample is imaged, but the diffraction plane. In the diffraction plane, a plane coinciding with or close to the back-focal plane of the objective lens, all electrons leaving the sample under one angle are focused in one point. As a result diffraction information can be used to gain information of the crystallographic structure of a sample.

It is noted that this is a very schematic representation of a TEM, and that a TEM typically comprises many more elements, such as deflectors, condenser stigmators (between the electron source and the sample), detectors (also surrounding the sample, e.g. for the detection of X-rays, cryo-shields (for keeping a sample and/or a detector at cryogenic temperatures).

Figure 3:
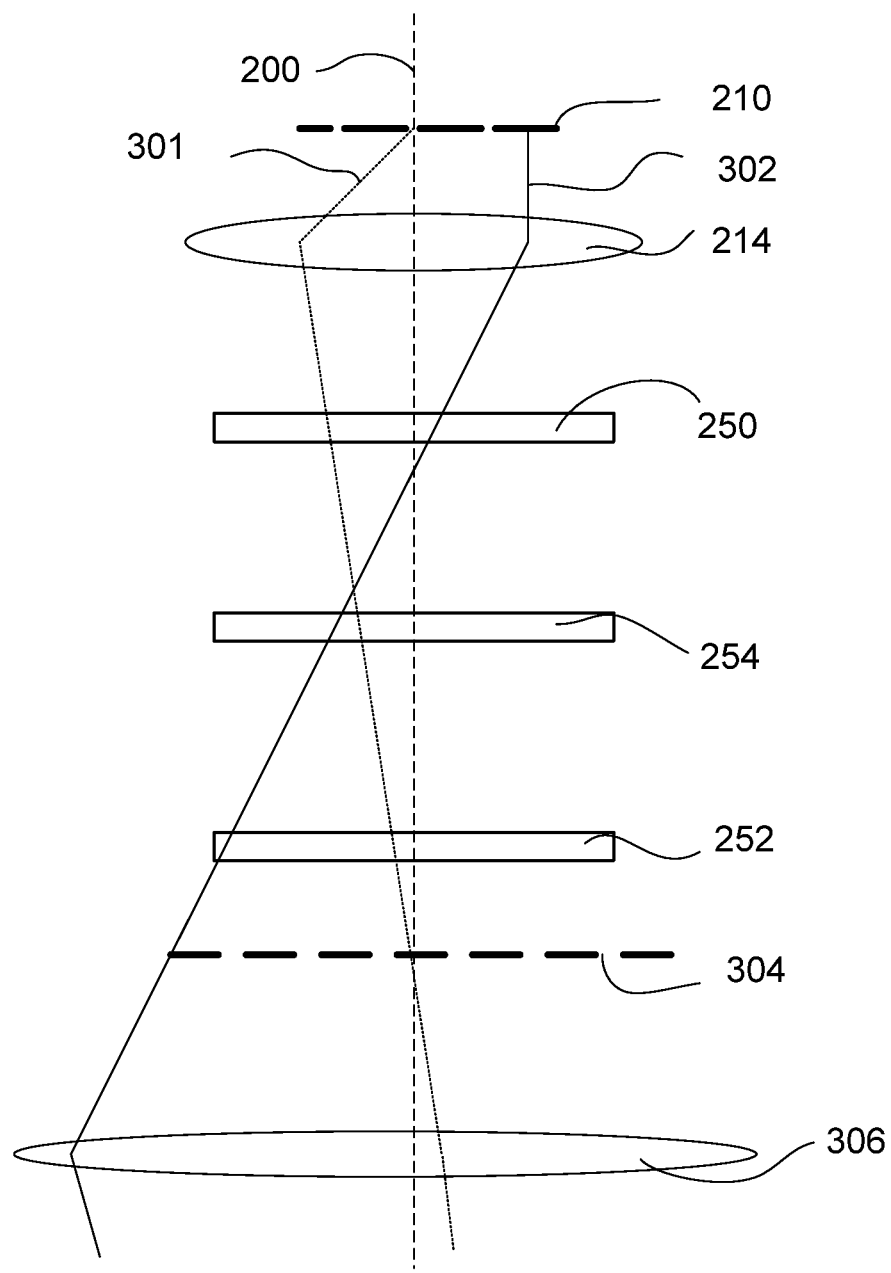
FIG. 3 schematically shows a detail of FIG. 2, showing the parts between the sample and the diffraction lens.

FIG. 3 schematically shows a detail of FIG. 2, in which the objective lens 214, the stigmators 250, 252, 254 and the diffraction lens 306 (the lens of the imaging system closest to the sample) are shown, as well as the sample 210 and the first intermediate image 304 thereof.

FIG. 3 also shows the two principal rays u (302) and v (301), described (in complex coordinates, i.e. x+iy) by $$\vec{v} = \begin{pmatrix} v(0) \\ v'(0) \end{pmatrix} = \begin{pmatrix} 0 \\ 1 \end{pmatrix}$$

and $$\vec{u} = \begin{pmatrix} u(0) \\ u'(0) \end{pmatrix} = \begin{pmatrix} 1 \\ 0 \end{pmatrix}.$$

The invention is based on the following insight:
For an optical system with N stigmators we can write:

$$A_{image} = \sum_{i=1}^{N} \bar{v}(z_i) \cdot v(z_i) \cdot A_i \quad [1]$$

$$A_{diffraction} = \sum_{i=1}^{N} \bar{u}(z_i) \cdot u(z_i) \cdot A_i \quad [2]$$

-continued $$D = 2 \cdot \sum_{i=1}^{N} \overline{v}(z_i) \cdot u(z_i) \cdot A_i \quad [3]$$

in which $A_i$ is the strength of the i-th stigmator ($1 \leq i \leq N$).
$A_{image}$ is the astigmatism in the image plane,
$A_{diffraction}$ is the astigmatism in the diffraction plane,
and D is the LD. The strength of each stigmator i is defined by $A_i$.

In hindsight it is obvious that there are at least three stigmators needed to obtain a solution where all three equations [1], [2] and [3] are zero. Using three stigmators, the result is then a unique solution for all three stigmators fulfilling all three demands simultaneously and thus the strength/excitation of the stigmators need not be changed when changing between imaging mode and diffraction mode. This in turn avoids ohmic heating and the associated drift of the apparatus.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A charged particle apparatus equipped with a charged particle source for emitting a beam of charged particles, downstream of said beam followed by condenser optics, followed by a sample position, followed by an objective lens, followed by imaging optics, and followed by a detector system, in which, between the objective lens and the detector system, a first stigmator is positioned for reducing astigmatism when imaging a sample on the detector system and a second stigmator is positioned for reducing astigmatism when the diffraction plane is imaged on the detector system, characterized in that a third stigmator is positioned between the objective lens and the detector system, as a result of which a third degree of freedom is created for reducing the linear distortion.

2. The apparatus of claim 1 in which the three stigmators are positioned between the objective lens and the imaging optics, as a result of which the excitation of the stigmators need not be changed when the settings of the imaging optics are changed.

3. The apparatus of claim 1, the apparatus equipped with a controller with a user interface, the user interface showing controls for controlling the stigmators, the controls controlling the stigmators in such a manner that image astigmatism, diffraction astigmatism and linear distortion are associated with independent controls.

4. The apparatus of claim 1 in which the apparatus is a Transmission Electron Microscope or a Scanning Transmission Electron Microscope.

5. Method of using the apparatus of claim 1, the method comprising exciting the first stigmator to reduce astigmatism when imaging the sample and exciting the second stigmator to reduce astigmatism when imaging the diffraction plane, characterized in that the method comprises exciting the third stigmator to reduce the linear distortion.

6. A charged particle apparatus, comprising:
 a charged particle source for emitting a beam of charged particles;
 a sample holder for holding a sample and positioning the sample with respect to the beam of charged particles;
 a first stigmator positioned for reducing astigmatism when imaging the sample;
 a second stigmator positioned for reducing astigmatism when imaging the diffraction plane; and
 a third stigmator positioned for reducing linear distortion.

7. The apparatus of claim 6 further comprising an objective lens for forming an image and one or more projector lenses to magnify the image.

8. The apparatus of claim 7 in which the three stigmators are positioned between the objective lens and the one or more projector lenses, as a result of which the excitation of the stigmators need not be changed when the settings of the imaging optics are changed.

9. The apparatus of claim 6 further comprising a controller with a user interface, the user interface having controls for controlling the stigmators, the controls controlling the stigmators in such a manner that image astigmatism, diffraction astigmatism and linear distortion comprise independent controls.

10. The apparatus of claim 6 in which the apparatus is a Transmission Electron Microscope or a Scanning Transmission Electron Microscope.

11. The apparatus of claim 10 in which the charged particle source provides a beam of electrons with an adjustable energy of between 50 keV and 400 keV.

12. The apparatus of claim 6 in which the three stigmators are configured to avoid ohmic heating and the associated drift of the apparatus.

13. A method of operating the charged particle beam apparatus of claim 6, comprising:
 forming a beam of charged particles;
 positioning the first stigmator such that when in imaging mode, the first stigmator affects astigmatism but does not affect the linear distortion;
 positioning the second stigmator such that when in diffraction mode, the second stigmator affects astigmatism but does not affect the linear distortion;
 positioning the third stigmator such that the third stigmator mainly affects the linear distortion and only slightly affects the astigmatism in imaging mode and diffraction mode;
 exciting the first stigmator to reduce the astigmatism in imaging mode;
 exciting the second stigmator to reduce the astigmatism in diffraction mode; and
 exciting the third stigmator to reduce the linear distortion.

14. The method of claim 13 in which no changes in excitation are needed when changing from imaging mode to diffraction mode or from diffraction mode to imaging mode.

* * * * *